United States Patent
Shono et al.

(10) Patent No.: US 6,797,647 B2
(45) Date of Patent: Sep. 28, 2004

(54) METHOD FOR FABRICATING ORGANIC THIN FILM

(75) Inventors: Tomofumi Shono, Takatsuki (JP); Kazuhiro Yamashita, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 65 days.

(21) Appl. No.: 09/987,004

(22) Filed: Nov. 13, 2001

(65) Prior Publication Data

US 2002/0192983 A1 Dec. 19, 2002

(30) Foreign Application Priority Data

Jun. 19, 2001 (JP) ........................................ 2001-184236

(51) Int. Cl.$^7$ .............................................. H01L 21/31
(52) U.S. Cl. ...................................... 438/780; 438/791
(58) Field of Search ................................ 438/780, 781, 438/793, 795, 906, 758, 761, 769, 778, 786, 791; 134/1.2, 1.3; 427/569, 563, 585, 583, 447

(56) References Cited

U.S. PATENT DOCUMENTS

| | | | | |
|---|---|---|---|---|
| 4,075,367 A | * | 2/1978 | Gulett | 134/1.3 |
| 5,234,990 A | | 8/1993 | Flaim et al. | |
| 6,029,679 A | * | 2/2000 | Ota et al. | 134/1.3 |
| 6,040,034 A | * | 3/2000 | Okada et al. | 428/143 |
| 6,517,642 B2 | * | 2/2003 | Horie et al. | 148/220 |

FOREIGN PATENT DOCUMENTS

| | | | | |
|---|---|---|---|---|
| JP | 52-114276 | 9/1977 | | |
| JP | 60-028235 | 2/1985 | | |
| JP | 62-286579 | 12/1987 | | |
| JP | 5-152200 | 6/1993 | | |
| JP | 05152200 A | * 6/1993 | ......... | H01L/21/027 |
| JP | 8-186072 | 7/1996 | | |
| JP | 09-219356 | 8/1997 | | |
| JP | 10-064864 | 3/1998 | | |
| JP | 11-084646 | 3/1999 | | |
| JP | 2000-079376 | 3/2000 | | |
| JP | 2000-095992 | 4/2000 | | |
| JP | 2001-151824 | 6/2001 | | |

* cited by examiner

Primary Examiner—George Fourson
Assistant Examiner—Brook Kebede
(74) Attorney, Agent, or Firm—McDermott, Will & Emery LLP (57) ABSTRACT

First, an undercoating film made of silicon nitride or silicon nitride oxide is formed on a substrate. Then the undercoating film is subjected to both/either process A of wet-cleaning the undercoating film with a cleaning liquid and/or process B of irradiating ultraviolet light onto the undercoating film. Afterward, an organic thin film is formed on the undercoating film by providing a liquid organic material (a specific organic material is used if only either process A or process B has been performed).

16 Claims, 8 Drawing Sheets

METHOD FOR FABRICATING ORGANIC THIN FILM

BACKGROUND OF THE INVENTION

The present invention relates to a method for fabricating an organic thin film that will serve as a resist film, an anti-reflection film or the likes.

As the systems bearing complex semiconductor integrated circuits have been downsized, it is becoming increasingly difficult to print complex circuit patterns onto a small semiconductor chip by the pattern lithography method that uses a resist pattern, namely, a patterned resist film, as a mask. As the wavelength of the energy beam used in the pattern lithography method becomes shorter, the beam which has passed through the photosensitive organic film serving as a resist film is reflected at higher reflectivity off the surface of the film to be etched (formed under the resist film). Then, undesired areas in the photosensitive organic film (the areas which should not be irradiated with the energy beam) other than the target areas for exposure may be subject to unintentional exposure.

To solve this problem, a method for reducing the reflection of the energy beam that has passed through the photosensitive organic film has been proposed in which an organic film that absorbs the energy beam is coated on the film to be etched as an anti-reflection film prior to the formation of the photosensitive organic film serving as a resist film.

Figure 9A:
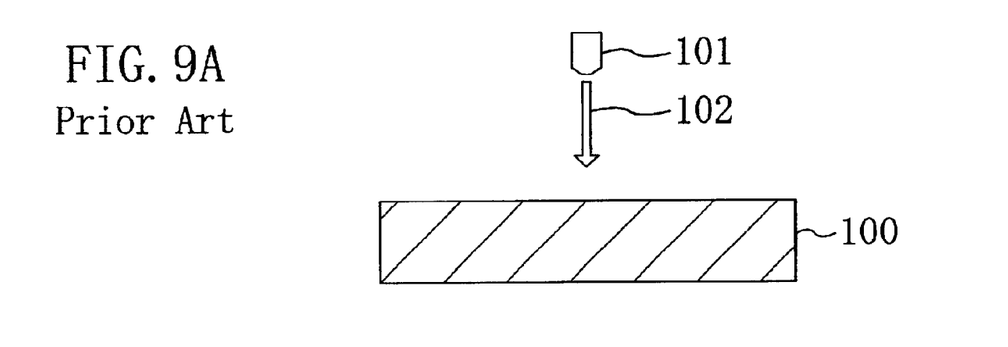
FIGS. 9A and 9B are sectional views illustrating steps of a conventional method for fabricating an organic thin film.
Figure 9B:
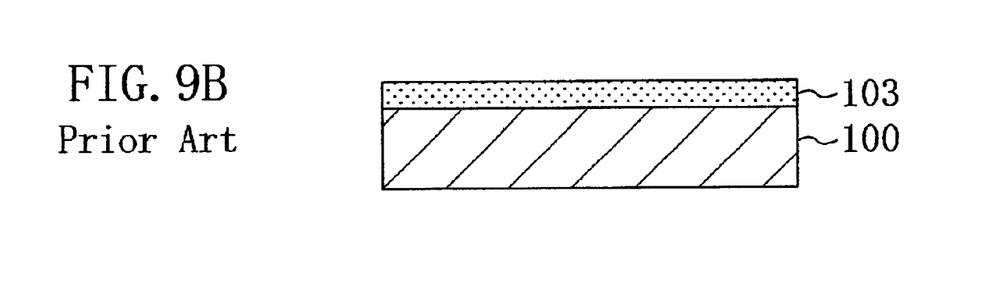

FIGS. 9A and 9B are sectional views illustrating steps of an organic thin film fabrication method according to the prior art.

Referring now to FIG. 9A, the semiconductor substrate 100 on which a film to be etched (not shown) has been formed is first subjected to wet-cleaning to remove particles that have stuck on the surface of the semiconductor substrate 100 when the film to be etched is formed, for example. To be more specific, the semiconductor substrate 100 is turned while a cleaning liquid 102 is supplied from a nozzle 101 onto the semiconductor substrate 100.

Next, as shown in FIG. 9B, an organic film 103, which will serve as a resist film or an anti-reflection film, is formed on the semiconductor substrate 100 of which wet-cleaning has been completed.

As the design rule for electronic devices becomes increasingly fine in recent years, it has become hard to form fine resist patterns when the photosensitive organic film serving as a resist film is thick. Besides, if the organic film serving as an anti-reflection film is thick, the resist film is subjected to undesired etching. To solve such a problem and enable to provide fine resist patterns, a few methods have been proposed for forming a thin organic film serving as a resist film or an anti-reflection film.

At least the same or higher levels of uniformity in film thickness are required in forming an organic thin film, compared with the case of forming an organic thick film.

Then it is necessary to increase the content of solvent in the organic material used in forming the organic thin film, in order to make viscosity of the organic material low. However, if the content of solvent in the organic material is raised, the uniformity of film thickness is more likely to be affected by the heat of vaporization of solvent (Japanese Patent Laid-Open Publication No. Hei. 8–186072).

In addition to the above-mentioned drawback, the inventors of the present invention have found another problem that if an organic thin film is formed 100 nm or less in thickness on a silicon nitride film or silicon nitride oxide film that is deposited as a hard mask or an inorganic anti-reflection film, a coating pattern running radially from the wafer center to its peripherals shows up (hereafter, coating unevenness) on the fabricated organic thin film. An organic thin film that has such coating unevenness cannot be used as a resist film or an anti-reflection film.

SUMMARY OF THE INVENTION

In view of the foregoing, it is, therefore, an object of the present invention to provide a method for forming organic thin films, using an organic material of a low viscosity, of uniform thickness and free of such coating unevenness, when forming an organic thin film onto the silicon nitride film or silicon nitride oxide film.

In order to attain the above object, a first method for fabricating an organic thin film according to the present invention comprises the steps of: forming an undercoating film made of silicon nitride or silicon nitride oxide on a substrate; wet-cleaning the undercoating film using a cleaning liquid; irradiating far ultraviolet ray onto the undercoating film of which wet-cleaning has been completed; and forming an organic thin film with a thickness of about 100 nm or thinner on the undercoating film onto which far ultraviolet ray has been irradiated by turning the substrate and providing a liquid organic material onto the substrate.

According to the first method for fabricating an organic thin film of the present invention, the undercoating film made of silicon nitride or silicon nitride oxide is wet-cleaned; far ultraviolet ray is irradiated onto the undercoating film; and then the organic thin film with a thickness of about 100 nm or thinner is formed on the undercoating film. Then compared with the conventional organic thin film fabrication method that conducts no irradiation of far ultraviolet ray onto the undercoating film, coating unevenness is unlikely to show up in the resulting organic thin film even when an organic material of low viscosity is employed. Therefore, the uniformity of thickness of the organic thin film can be improved. When the organic thin film is formed as a resist film or anti-reflection film, it becomes possible to make fine resist patterns. Then it becomes also possible to provide electronic devices of finer design rules.

A second method for fabricating an organic thin film according to the present invention comprises the steps of:
  forming an undercoating film made of silicon nitride or silicon nitride oxide on a substrate; wet-cleaning the undercoating film using a cleaning liquid; and forming an organic thin film with a thickness of about 100 nm or thinner on the undercoating film, of which wet-cleaning has been completed, by turning the substrate and providing a liquid organic material onto the substrate; wherein the organic material contains at least one solvent selected from the group consisting of propylene glycol monomethyl ether acetate, propylene glycol monomethyl-ether, ethyl lactate, ethyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate.

According to the second method for fabricating an organic thin film of the present invention, the undercoating film made of silicon nitride or silicon nitride oxide is wet-cleaned and then organic thin film with a thickness of about 100 nm or thinner is formed on the undercoating film by the use of an organic material containing at least one solvent selected from the group consisting of propylene glycol monomethyl ether acetate, propylene glycol monomethyl ether, ethyl lactate, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate. Then, compared with the conventional organic thin film fabrication method that does not use an organic material containing the above solvent, coating unevenness is unlikely to show up in the resulting organic thin film even when an organic material of low viscosity is employed and therefore the uniformity of the thickness of the organic thin film can be improved. When the organic thin film is formed as a resist film or anti-reflection film, it becomes thereby possible to make the resist pattern finer. Then it also becomes possible to provide electronic devices of finer design rules.

Further, compared with the first method of the invention, the second method does not need the irradiation process of far ultraviolet ray onto the undercoating film. As a result, the organic thin film fabrication process can be simplified and its processing time can be shortened.

In the first and second organic thin film fabrication methods, the step for wet-cleaning preferably includes a step of applying ultrasonic wave in the cleaning liquid.

Then particles that have stuck on the surface of the undercoating film during the formation of the undercoating film can be reliably removed.

In the first and second organic thin film fabrication methods, it is preferable to insert a step of forming another organic thin film on the undercoating film and then removing this organic thin film between the step of forming the undercoating film and the step of wet-cleaning.

Then residues that have stuck on the surface of the undercoating film during the removal of another organic thin film can be removed reliably by the wet-cleaning.

A third method for fabricating an organic thin film according to the present invention comprises the steps of:

forming an undercoating film made of silicon nitride or silicon nitride oxide on a substrate; irradiating far ultraviolet ray onto the undercoating film;, and forming an organic thin film with a thickness of about 100 nm or thinner on the undercoating film onto which far ultraviolet ray has been irradiated by turning the substrate and providing a liquid organic material onto the substrate; wherein the organic material contains at least one solvent selected from the group consisting of propylene glycol monomethyl ether acetate, propylene glycol monomethyl ether, ethyl lactat6, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate.

According to the third method for fabricating an organic thin film of the present invention, after far ultraviolet ray is irradiated onto the undercoating film made of silicon nitride or silicon nitride oxide formed on the substrate, an organic a thin film with a thickness of about 100 nm or thinner is formed on the undercoating film by the use of an organic material containing at least one solvent selected from the group consisting, of propylene glycol monomethyl ether acetate, propylene glycol monomethyl ether, ethyl lactate, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate. Then compared with the conventional organic thin film fabrication method that does not conduct far ultraviolet ray irradiation on the undercoating film or use an organic material containing the above solvent, coating unevenness is unlikely to show up in the organic thin film even when an organic material of low viscosity is employed. Therefore, the uniformity of thickness of the organic thin film can be improved. When the organic thin film is formed as a resist film or anti-reflection film, it becomes possible to make fine resist patterns. Then it becomes also possible to provide electronic devices of finer design rules.

Further, compared with the first method of the invention, the third method does not need the wet-cleaning process for the undercoating film. As a result, the organic thin film fabrication process can be simplified and its processing time can be shortened.

In the first and third fabrication methods, the step of irradiating far ultraviolet ray preferably includes a step of performing heat treatment on the substrate.

Then it becomes possible to reliably prevent the occurrence of coating unevenness in the organic thin film.

In the first, second and third methods, it is preferable to make the total amount of the organic material used in the step of forming the organic thin film at least 0.8 ml.

Then uniformity in the thickness of the resulting organic thin film can be further improved.

DETAILED DESCRIPTION OF THE INVENTION

Embodiment 1

Now the method for fabricating an organic thin film according to the first embodiment will be described below with reference to the accompanying drawings.

FIGS. 1A–1D are sectional views illustrating the steps of the organic thin film fabrication method according to a first embodiment of the invention.

Figure 1A:
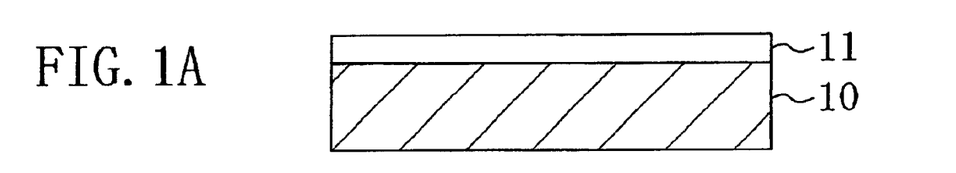
FIGS. 1A–1D are sectional views illustrating steps of a method for fabricating an organic thin film according to a first embodiment of the present invention.

First, as shown in FIG. 1A, an undercoating film 11 made of silicon nitride or silicon nitride oxide is formed on a semiconductor substrate 10 of an 8-inch silicon wafer by chemical vapor deposition.

Figure 1B:
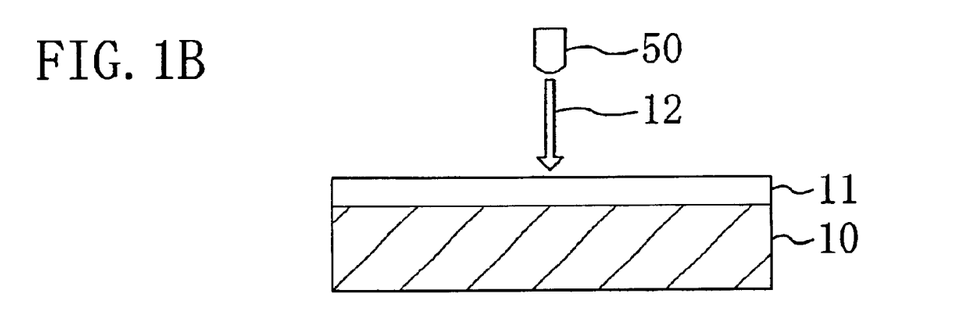

Next, as shown in FIG. 1B, a cleaning liquid 12 is supplied from a nozzle 50 onto the semiconductor substrate 10 and the semiconductor substrate 10 is turned for the wet-cleaning treatment of the undercoating film 11. At the same time, ultrasonic wave is applied to the cleaning liquid 12 for improving the cleaning effect.

Figure 2:
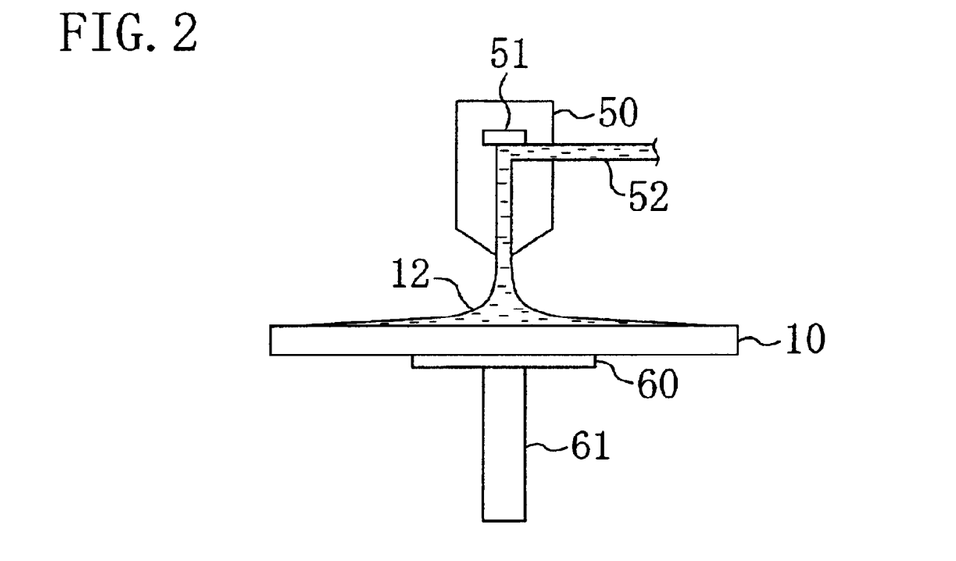
FIG. 2 is a diagram specifically illustrating the wet-cleaning process for the method for fabricating an organic thin film according to the first embodiment of the invention.

FIG. 2 is a diagram specifically illustrating the wet-cleaning process in the method for fabricating an organic thin film according to the first embodiment of the invention.

Referring now to FIG. 2, the semiconductor substrate 10 is held by a wafer chuck 60 fixed on a rotary shaft 61 of a motor. While the semiconductor substrate 10 is turned around the rotary shaft 61, the cleaning liquid 12 is injected from the nozzle 50 onto the semiconductor substrate 10 for cleaning the surface of the semiconductor substrate 10. Simultaneously, an ultrasonic oscillator 51 installed in the nozzle 50 applies ultrasonic wave, for example, of a frequency of 1 MHz and an output power of 100 W, to the cleaning liquid 12 running in a tube 52.

In the first embodiment, the cleaning liquid 12 was pure water in which $CO_2$ was dissolved. When $CO_2$ is dissolved in pure water, the electric resistance of water decreases and then the electrostatic damage of the semiconductor substrate 10 can be prevented. Indeed, while the specific resistance of pure water is 18 MÙ, that of the $CO_2$-dissolved water is down to 0.01 MÙ.

Figure 1C:
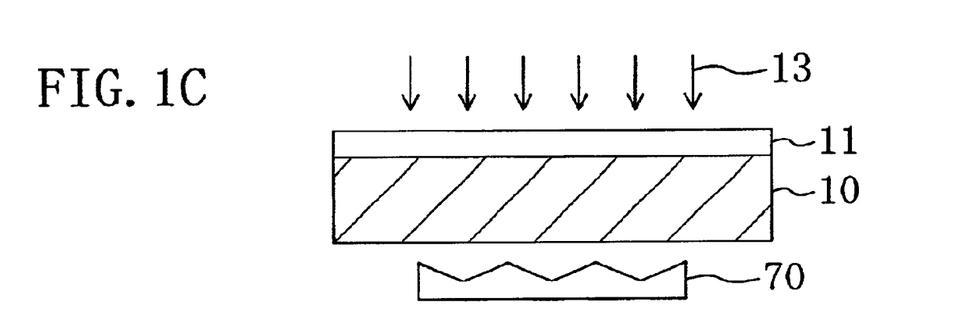

Next as shown in FIG. 1C, far ultraviolet ray 13 is irradiated onto the undercoating film 11 in order to reliably remove even small particles sticking on the surface of the undercoating film 11. The far ultraviolet ray 13 irradiation process shown in FIG. 1C comprises the combination of an irradiation process of far ultraviolet ray 13 (hereafter, lamp mode) and heating process of the semiconductor substrate 10 with a heater 70 (hereafter, heating mode). The total time for this combined process is 155 seconds. For the lamp mode, the irradiation is set at OFF for the first 10 seconds in the combined process, ON for the following 2 seconds, OFF for the following 58 seconds, ON for the following 75 seconds, and OFF for the last 10 seconds. For the heating mode, the heating temperature is set at 100° C. for the first 70 seconds in the combined process and at 140° C. for the rest 85 seconds.

Figure 1D:
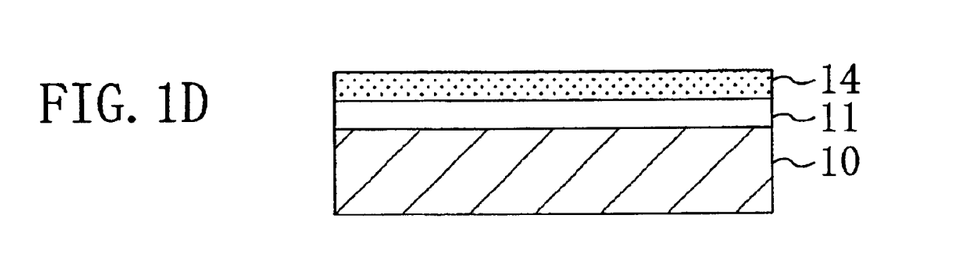

Next as shown in FIG. 1D, an organic material is spin-coated over the undercoating film 11 to form an organic thin film 14 with a thickness of about 60 nm as an anti-reflection film.

Figure 3:
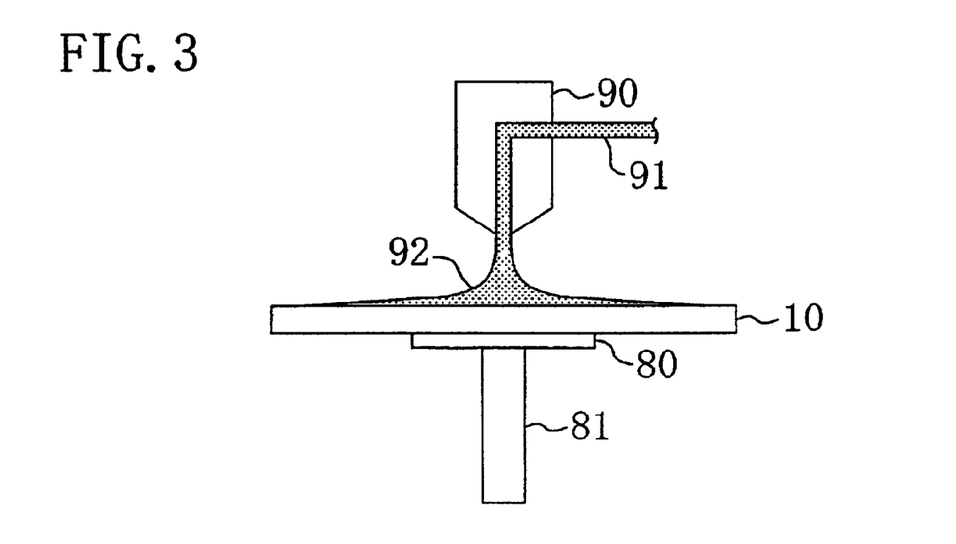
FIG. 3 is a diagram specifically illustrating the spin-coating of the organic material in the method for fabricating an organic thin film according to the first embodiment of the invention.

FIG. 3 is a diagram specifically illustrating the organic material spin-coating method in the method for fabricating an organic thin film according to the first embodiment of the invention.

Referring to FIG. 3, the semiconductor substrate 10 is held by a wafer chuck 80 fixed on a rotary shaft 81 of a motor. The organic thin film 14 is formed on the undercoating film 11 by dropping a liquid organic material 92 from a tube 91 inside a nozzle 90 toward the center of the semiconductor substrate 10, while the semiconductor substrate 10 is turned around the rotary shaft 81. Cyclohexanone is used as the solvent for the organic material 92 and the total amount of the organic material 92 dropped onto the semiconductor substrate 10 is controlled at 1.5 ml.

There was no coating unevenness recognized in the resulting organic thin film 14 (about 60 nm thick) that was formed by the method described so far. In addition, the thickness of the organic thin film 14 was very uniform over the substrate and fluctuations in its thickness were within 3 nm.

Although not shown in the figure, after a resist film is formed on the organic thin film 14, the resist film is exposed using the organic thin film 14 as an anti-reflection film. Then, a resist pattern is created by developing the resist film.

Namely, according to the first embodiment of the invention, the undercoating film 11 made of silicon nitride or silicon nitride oxide is wet-cleaned; far ultraviolet ray 13 is irradiated onto the undercoating film 11; and then the organic thin film 14 is formed on the undercoating film 11. According to the proposed method, compared with the conventional organic thin film fabrication method that conducts no irradiation of far ultraviolet ray onto the undercoating film, coating unevenness is unlikely to show up in the organic thin film 14 even when an organic material of low viscosity is employed. Therefore, the uniformity of thickness of the organic thin film 14 can be improved. When the anti-reflection film made of the organic thin film 14 can be uniformly fabricated, the resist film as well can be uniformly coated on the anti-reflection film and it becomes possible to make the resist pattern finer. It becomes thereby possible to provide electronic devices of finer design rules.

In the first embodiment, the thickness of the organic thin film 14 is not limited to a particular value. However, if it is 100 nm or thinner, the coating unevenness can be significantly reduced, compared with that attained by the conventional organic thin film fabrication method. In the first embodiment, the organic thin film 14 which was about 60 nm in thickness was formed. When an ultra-thin (about 20 nm) organic thin film was formed by the method of the present invention, also there was no coating unevenness recognized.

The total amount of an organic material 92 that is dropped onto the semiconductor substrate 10 is not limited to a specific value in the first embodiment. However, if its total amount is at least 0.8 ml, it becomes possible to reliably prevent coating unevenness in the organic thin film 14. Besides, as the dropped amount of such an organic material is increased, the organic material 92 easily spreads over the semiconductor substrate 10 with a uniform thickness and then the uniformity of thickness of the resulting organic thin film 14 can be improved.

In the first embodiment, it is not always necessary to apply ultrasonic wave to the cleaning liquid 12 in the cleaning process shown in FIG. 1B.

Besides, in the first embodiment, during the irradiation process of far ultraviolet ray 13 shown in FIG. 1C, the heating with the heater 70 is not essential.

Also in the first embodiment, instead of the organic thin film 14 formed as an anti-reflection film, a photosensitive organic film serving as a resist film or an organic insulating film serving as an inter-layer film may be formed.

Further, the semiconductor substrate 10 employed in the first embodiment may be replaced by another substrate, for example, glass substrate.

Variation of Embodiment 1

Now the method for fabricating an organic thin film according to a variation of the first embodiment will be described below with reference to the accompanying drawings.

FIGS. 4A–4C and FIGS. 5A–5C are sectional views illustrating the steps of the method for fabricating an organic thin film according to a variation of the first embodiment of the invention.

Figure 4A:
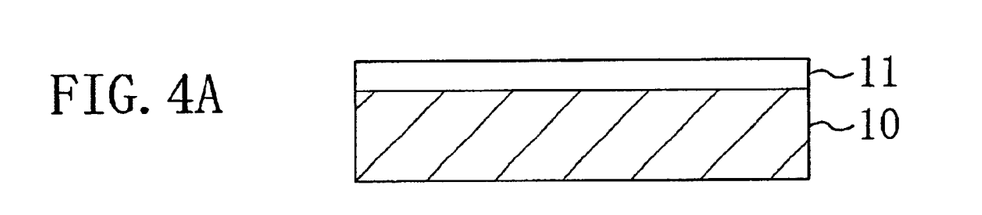
FIGS. 4A–4C are sectional views illustrating steps of the method for fabricating an organic thin film according to a variation of the first embodiment of the invention.

First, as shown in FIG. 4A similar to FIG. 1A of the first embodiment, an undercoating film 11 made of silicon nitride or silicon nitride oxide is formed on a semiconductor substrate 10 of an 8-inch silicon wafer by chemical vapor deposition.

Figure 4B:
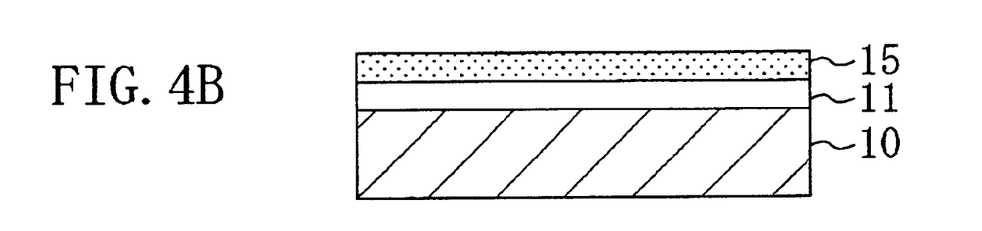

Next as shown in FIG. 4B, an organic material is spin-coated over the undercoating film 11 to form a first organic thin film 15 with a thickness of about 60 nm as an anti-reflection film. Specifically, the first organic thin film 15 is formed on the undercoating film 11 by dropping a liquid organic material onto the center of the semiconductor substrate 10 (see FIG. 3), while the semiconductor substrate 10 is held by a substrate holding mechanism and being turned. Cyclohexanone is used as the solvent for the organic material and the total amount of the organic material dropped is controlled at 1.5 ml.

In the process shown in FIG. 4B, however, coating unevenness resulted in the first organic thin film 15 and fluctuations in thickness of the first organic thin film 15 were about 25 nm, which was not a satisfactory level.

Figure 4C:
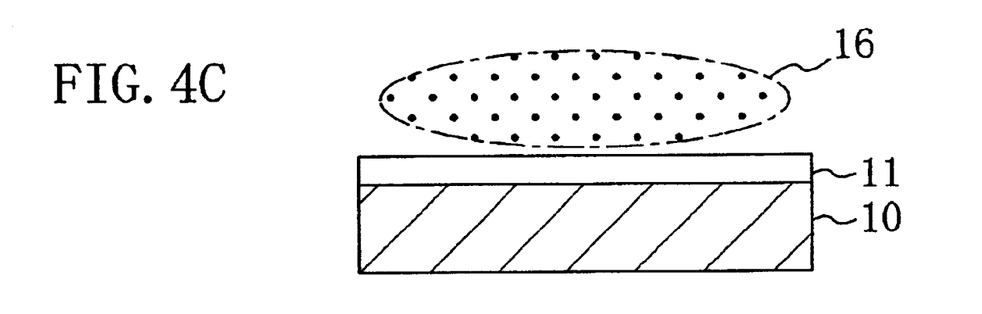

In order to remove the first organic thin film 15 having such coating unevenness, active oxygen atoms and ozone 16 that have been produced by decomposing oxygen with plasma are carried onto this organic thin film 15 for ashing, as shown in FIG. 4C.

Figure 5A:
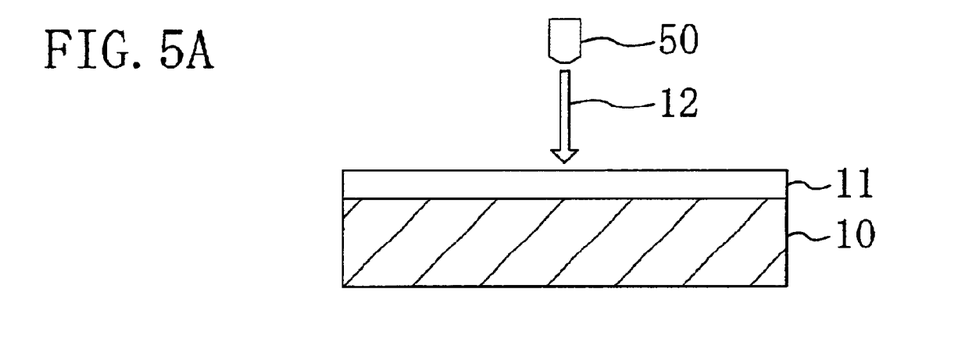
FIGS. 5A–5C are sectional views illustrating steps of the method for fabricating an organic thin film according to a variation of the first embodiment of the invention.

Next, referring to FIG. 5A that is similar to FIG. 1B of the first embodiment, in order to remove particles that have not been taken away from the surface of the undercoating film 11 by the ashing of FIG. 4C, the cleaning liquid 12, pure water containing $CO_2$, for example, is supplied from the nozzle 50 onto the semiconductor substrate 10 for wet-cleaning the undercoating film 11, while the semiconductor substrate 10 is being turned. At this time, ultrasonic wave, for example, of a frequency of 1 MHz and an output power of 100 W, is applied to the cleaning liquid 12(see FIG. 2).

Figure 5B:
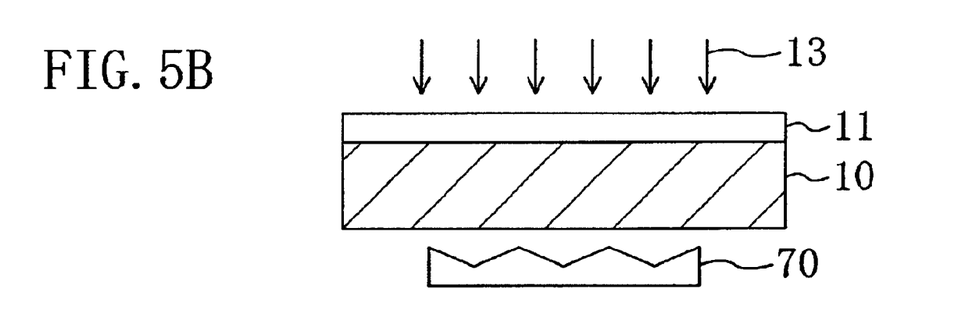

Next as shown in FIG. 5B similar to FIG. 1C of the first embodiment, far ultraviolet ray 13 is irradiated onto the undercoating film 11 in order to reliably remove even small particles sticking on the surface of the undercoating film 11. The far ultraviolet ray 13 irradiation process shown in FIG. 5B comprises the combination of an irradiation process of far ultraviolet ray 13, namely lamp mode, and heating process of the semiconductor substrate 10 with a heater 70, namely heating mode. The total time for this combined process is 155 seconds. For the lamp mode, the irradiation is set at OFF for the first 10 seconds in the combined process, ON for the following 2 seconds, OFF for the following 58 seconds, ON for the following 75 seconds, and OFF for the last 10 seconds. For the heating mode, the heating temperature is set at 100° C. for the first 70 seconds in the combined process and at 140° C. for the rest 85 seconds.

Figure 5C:
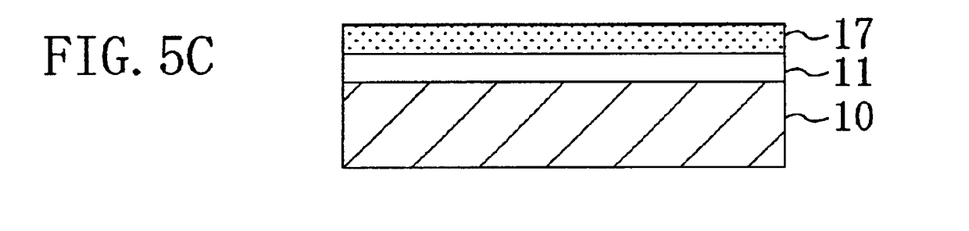

Next as shown in FIG. 5C, an organic material is spin-coated over the undercoating film 11 to form a second organic thin film 17 with a thickness of about 60 nm as an anti-reflection film. Specifically, the second organic thin film 17 is formed on the undercoating film 11 by dropping a liquid organic material onto the center of the semiconductor substrate 10(see FIG. 3), while the semiconductor substrate 10 is held by a substrate holding mechanism and being turned. At the same time, cyclohexanone is used as the solvent for the organic material and the total amount of the organic material dropped is controlled at 1.5 ml.

There was no coating unevenness in the second organic thin film 17 (about 60 nm thick) that was formed by the method described above. In addition, the thickness of the second organic thin film 17 was very uniform over the substrate and fluctuations in its thickness were within 3 nm.

Although not shown in the figure, after a resist film is formed on the second organic thin film 17, the resist film is exposed using the second organic thin film 17 as an anti-reflection film. Then, a resist pattern is created by developing the resist film.

Namely, according to the variation of the first embodiment of the invention, the undercoating film 11 made of silicon nitride or silicon nitride oxide is wet-cleaned; far ultraviolet ray 13 is irradiated onto the undercoating film 11; and then the second organic thin film 17 is formed on the undercoating film 11. Then compared with the conventional organic thin film fabrication method that conducts no irradiation of far ultraviolet ray onto the undercoating film, coating unevenness is unlikely to show up in the second organic thin film 17 even when an organic material of low viscosity is employed. Therefore, the uniformity of thickness of the second organic thin film 17 can be improved. When the anti-reflection film made of the second organic thin film 17 can be uniformly fabricated, the resist film as well can be uniformly formed on the anti-reflection film and it becomes possible to make the resist pattern finer. It becomes thereby possible to provide electronic devices of finer design rules.

According to the variation of the first embodiment, after the first organic thin film 15 has been formed on the undercoating film 11, the first organic thin film 15 that has coating unevenness is removed, and then the undercoating film 11 is wet-cleaned. As a result, residues that have stuck on the surface of the undercoating film 11 during the removal of the first organic thin film 15 are reliably removed.

In the variation of the first embodiment, the thickness of the second organic thin film 17 is not limited to a particular value. However, if it is 100 nm or thinner, the coating unevenness can be significantly reduced, compared with that attained by the conventional organic thin film fabrication method. In the first embodiment, the second organic thin film 17 which was about 60 nm in thickness was formed. When an ultra-thin (about 20 nm) organic thin film was formed by the method of the present invention, there was no coating unevenness recognized.

The amount of an organic material that is dropped on the semiconductor substrate 10 for the fabrication of the second organic thin film 17 is not limited to a specific value in the variation of the first embodiment. However, if its total amount is at least 0.8 ml, it becomes possible to reliably prevent coating unevenness in the second organic thin film 17. Besides, as the amount of the organic material is increased, the organic material easily spreads over the semiconductor substrate 10 with a uniform thickness and then the uniformity of thickness of the second organic thin film 17 can be improved obviously.

In the variation of the first embodiment, it is not always necessary to apply ultrasonic wave in the cleaning liquid 12 during the cleaning process shown in FIG. 5A.

In the variation of the first embodiment, it is not always necessary to perform the heating using the heater 70 during the far ultraviolet ray irradiation process of FIG. 5B.

Also in the variation of the first embodiment, instead of the second organic thin film 17 formed as an anti-reflection film, a photosensitive organic film serving as a resist film or an organic insulating film serving as an inter-layer film may be formed.

Further, the semiconductor substrate 10 employed in the first embodiment may be replaced by another substrate, for example, glass substrate, in the variation of the first embodiment.

First Comparative Example

The method of forming an organic thin film according to a first comparative example is described below with reference to the accompanying drawings.

Figure 6A:
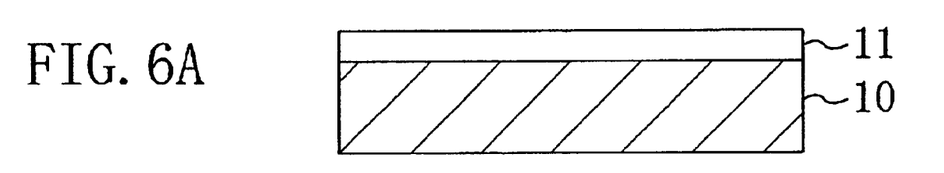
FIGS. 6A–6C are sectional views illustrating steps of a method for fabricating an organic thin film according to a first comparative example.
Figure 6B:
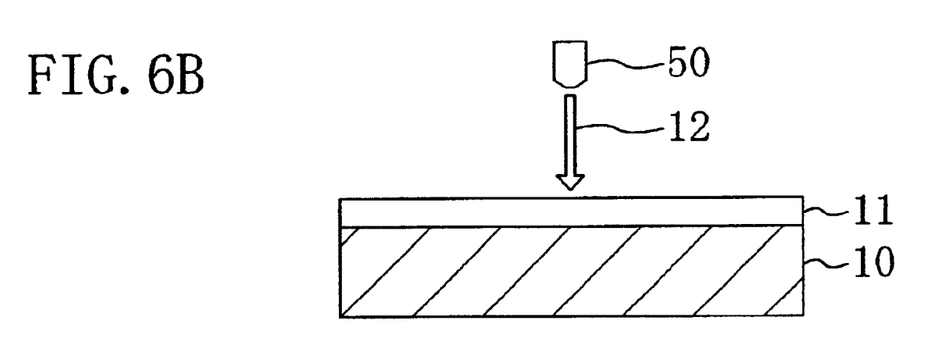
Figure 6C:
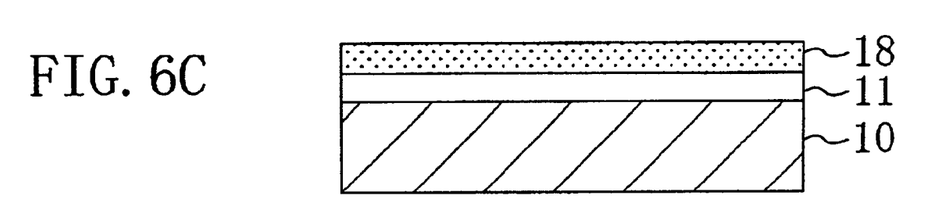

FIGS. 6A–6C are sectional views illustrating the steps of the organic thin film fabrication method according to the first comparative example.

First, as shown in FIG. 6A similar to FIG. 1A of the first embodiment, an undercoating film 11 made of silicon nitride or silicon nitride oxide is formed by the chemical vapor deposition method on a semiconductor substrate 10 made of an 8-inch silicon wafer.

Next as shown in FIG. 6B similar to FIG. 1B of the first embodiment, the undercoating film 11 is wet-cleaned by turning the semiconductor substrate 10, while supplying a cleaning liquid 12, for example, pure water containing $CO_2$, from a nozzle 50 over the semiconductor substrate 10. At the same time, ultrasonic wave of a frequency of 1 MHz and an output power of 100 W, for example, is applied to the cleaning liquid 12 to improve the cleaning effect (see FIG. 2).

Then as shown in FIG. 6C, an organic material is spin-coated on the undercoating film 11 to form an anti-reflection film made of an organic thin film 18 that is around 60 nm thick. To be more specific, the semiconductor substrate 10 is turned, with the semiconductor substrate 10 being held by a substrate holding mechanism, and then a liquid organic material is dropped onto the center of the turning semiconductor substrate 10 (see FIG. 3) to form the organic thin film 18. In this process, cyclohexanone is used as the solvent for the liquid organic material and the total amount of the dropped organic material is set at 1.5 ml.

Namely, in the first comparative example, the organic thin film 18 is formed with no irradiation of far ultraviolet ray 13 that was shown in FIG. 1C for the first embodiment.

Coating unevenness was found in the organic thin film 18 that was formed according to the above method. Besides, fluctuations in thickness of the organic thin film 18 were about 25 nm, which was not a satisfactory level.

In the first comparative example, similar coating unevenness was found when diglyme or methyl isobutyl ketone, instead of cyclohexanone, was used as the solvent of the organic material for forming the organic thin film 18.

Embodiment 2

Referring now to the accompanying drawings, the method for fabricating an organic thin film according to a second embodiment of the present invention will be described below.

Figure 7A:
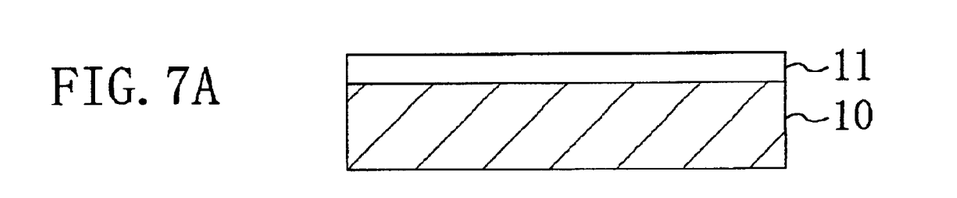
FIGS. 7A–7C are sectional views illustrating steps of a method for fabricating an organic thin film according to a second embodiment of the invention.
Figure 7B:
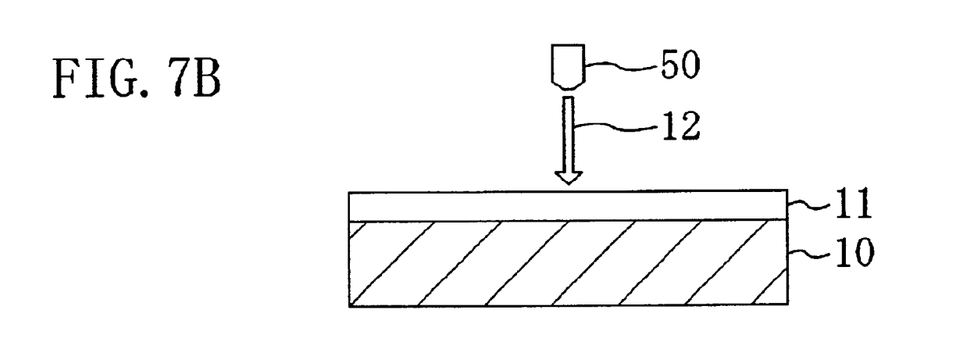
Figure 7C:
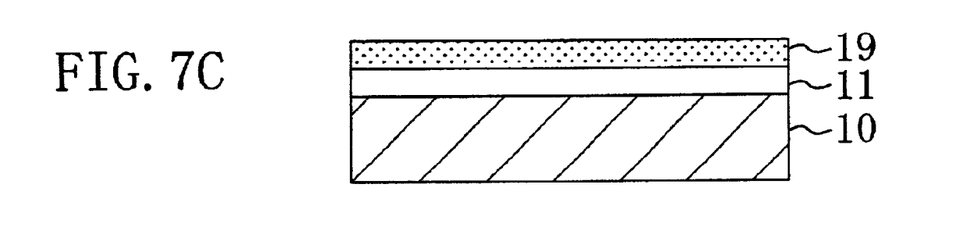

FIGS. 7A–7C are sectional views illustrating the steps of the organic thin film fabrication method according to the second embodiment of the invention.

First, as shown in FIG. 7A similar to FIG. 1A of the first embodiment, an undercoating film 11 made of silicon nitride or silicon nitride oxide is formed on a semiconductor substrate 10 made of an 8-inch silicon wafer by chemical vapor deposition.

Next as shown in FIG. 7B similar to FIG. 1B of the first embodiment, the undercoating film 11 is wet-cleaned by turning the semiconductor substrate 10, supplying a cleaning liquid 12, for example, pure water containing $CO_2$, from a nozzle 50 over the semiconductor substrate 10. At the same time, ultrasonic wave of a frequency of 1 MHz and an output power of 100 W, for example, is applied to the cleaning liquid 12 to improve the cleaning effect (see FIG. 2).

Then as shown in FIG. 7C, an organic material is spin-coated on the undercoating film 11 to form an anti-reflection film made of an organic thin film 19 that is around 60 nm thick. To be more specific, the semiconductor substrate 10 is turned, with the semiconductor substrate 10 being held by a substrate holding mechanism, and then a liquid organic material is dropped onto the center of the turning semiconductor substrate 10 (see FIG. 3) to form the organic thin film 19. In this process, propylene glycol monomethyl ether acetate is used as the solvent for the liquid organic material and the total amount of the dropped organic material is set at 1.5 ml.

There was no coating unevenness recognized in the organic thin film 19 (about 60 nm thick) that was formed by the method described above. In addition, the thickness of the organic thin film 19 was very uniform and fluctuations in thickness were 2 nm or less which is better than that in the first embodiment.

Although not shown in the figure, after a resist film is formed on the organic thin film 19, the resist film is exposed using the organic thin film 19 as an anti-reflection film. Then, the resist pattern is formed by developing the resist film.

Namely, according to the second embodiment of the invention, the undercoating film 11 made of silicon nitride or silicon nitride oxide is wet-cleaned and then the organic thin film 19 is formed on the undercoating film 11 by the use of an organic material containing propylene glycol monomethyl ether acetate as the solvent. According to the proposed method, compared with the conventional organic thin film fabrication method that does not use an organic material containing propylene glycol monomethyl ether acetate, coating unevenness is unlikely to show up in the organic thin film 19 even when an organic material of low viscosity is employed and therefore the uniformity of the thickness of the organic thin film 19 can be improved. When the anti-reflection film made of the organic thin film 19 can be uniformly fabricated, the resist film as well can be uniformly coated on the anti-reflection film and it becomes thereby possible to make the resist pattern finer. Then it also becomes possible to provide electronic devices of finer design rules.

Further, compared with the first embodiment, the second embodiment does not need the irradiation process (see FIG. 1C) of far ultraviolet ray 13 onto the undercoating film 11. As a result, the organic thin film fabrication process can be simplified and its processing time can be shortened.

In the second embodiment, the thickness of the organic thin film 19 is not limited to a particular value. However, if it is 100 nm or thinner, the coating unevenness can be significantly reduced, compared with that provided by the conventional organic thin film fabrication method. In the second embodiment, the organic thin film 19 which was about 60 nm in thickness was formed. When an ultra-thin (about 20 nm) organic thin film was formed by the method described in this embodiment, there was no coating unevenness recognized.

The amount of an organic liquid that is dropped on the semiconductor substrate 10 for the formation of the organic thin film 19 is not limited to a specific value in the second embodiment. However, if it is at least 0.8 ml, coating unevenness does not occur in the organic thin film 19. Besides, as the amount of such a liquid organic material is increased, the organic material easily spreads over the semiconductor substrate 10 with a uniform thickness and then it becomes easier to make the thickness of the organic thin film 19 uniform.

In the second embodiment, it is not always necessary to apply ultrasonic wave in the cleaning liquid 12 during the cleaning process shown in FIG. 7B.

Also in the second embodiment, instead of the organic thin film 19 formed as an anti-reflection film, a photosensitive organic film serving as a resist film or an organic insulating film serving as an inter-layer film may be formed.

Further, the semiconductor substrate 10 employed in the second embodiment may be replaced by another substrate, for example, glass substrate.

In the second embodiment, propylene glycol monomethyl ether acetate was used as the solvent for the organic material in the fabrication of the organic thin film 19. If the organic material for use in forming the organic thin film 19 contains at least one solvent of propylene glycol monomethyl ether acetate, propylene glycol monomethyl ether, ethyl lactate, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate, the same effect as that obtained in this embodiment is provided. On the other hand, if cyclohexanone, diglyme or methyl isobutyl ketone is used as the solvent for the organic material in toning the organic thin film 19, the same effect as that of the present embodiment was not provided and coating unevenness was recognized in the fabricated organic thin film.

In the second embodiment, a step of forming another organic thin film on the undercoating film 11 and then removing this organic thin film may be added between the steps of forming the undercoating film 11 shown in FIG. 7A and of wet-cleaning shown in FIG. 7B. Then residues that have stuck on the surface of the undercoating film upon removing the another organic thin film are removed by the wet-cleaning process with reliability.

Embodiment 3

Referring now to the accompanying drawings, the method for fabricating an organic thin film according to a third embodiment of the present invention will be described below.

Figure 8A:
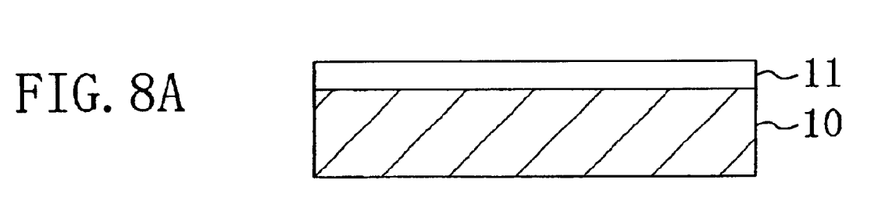
FIGS. 8A–8C are sectional views illustrating steps of a method for fabricating an organic thin film according to a third embodiment of the invention.
Figure 8B:
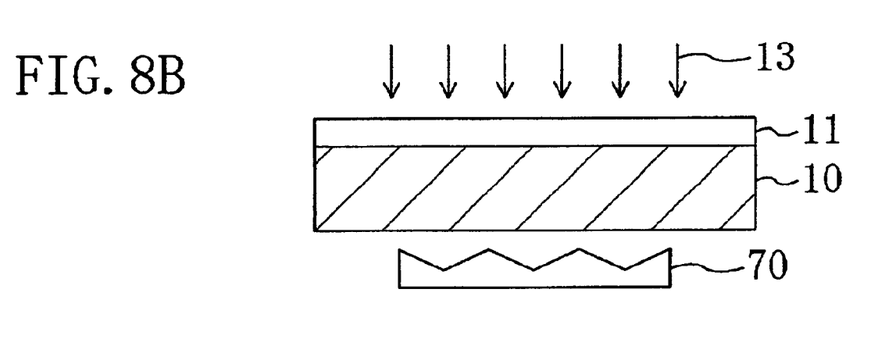
Figure 8C:
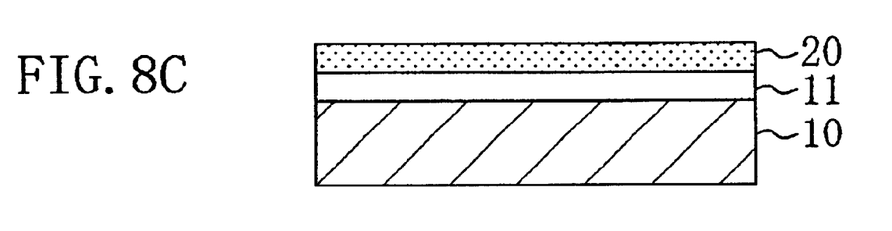

FIGS. 8A–8C are sectional views illustrating the steps of the organic thin film fabrication method according to the third embodiment of the invention.

First, as shown in FIG. 8A similar to FIG. 1A of the first embodiment, an undercoating film 11 made of silicon nitride or silicon nitride oxide is formed on a semiconductor substrate 10 made of an 8-inch silicon wafer by chemical vapor deposition.

Next as shown in FIG. 8B similar to FIG. 1C of the first embodiment, far ultraviolet ray 13 is irradiated onto the undercoating film 11. The far ultraviolet ray 13 irradiation process shown in FIG. 8B comprises the combination of an irradiation process of far ultraviolet ray 13 (hereafter, lamp mode) and a heating process of the semiconductor substrate 10 with a heater 70 (hereafter, heating mode). The total time for this combined process is 155 seconds. For the lamp mode, the irradiation is set at OFF for the first 10 seconds in the combined process, ON for the following 2 seconds, OFF for the following 58 seconds, ON for the following 75 seconds, and OFF for the last 10 seconds. For the heating mode, the heating temperature is set at 100° C. for the first 70 seconds in the combined process and at 140° C. for the rest 85 seconds.

Then as shown in FIG. 8C, an organic material is spin-coated on the undercoating film 11 to form an anti-reflection film made of an organic thin film 20 that is about 60 nm thick. To be more specific, the semiconductor substrate 10 is turned, with the semiconductor substrate 10 being held by a substrate holding mechanism, and then a liquid organic material is dropped onto the center of the turning semiconductor substrate 10 (see FIG. 3) to form the organic thin film 20. In this process, propylene glycol monomethyl ether acetate is used as the solvent for the liquid organic material and the total amount of the dropped organic material is set at 1.5 ml.

There was no coating unevenness in the organic thin film 20 (about 60 nm thick) that was formed by the method described above. In addition, the thickness of the organic thin film 20 was very uniform and fluctuations in thickness were 2 nm or less which is better than that in the first embodiment.

Although not shown in the figure, after a resist film is formed on the organic thin film 20, the resist film is exposed using the organic thin film 20 as an anti-reflection film. Then, the resist pattern is created by developing the resist film.

Namely, according to the third embodiment of the invention, far ultraviolet ray 13 is irradiated onto the undercoating film 11 that is made of silicon nitride or silicon nitride oxide and formed on the semiconductor substrate 10, and then the organic thin film 20 is formed on the undercoating film 11 by the use of an organic material containing propylene glycol monomethyl ether acetate as the solvent. According to the proposed method, compared with the conventional organic thin film fabrication method that does not conduct far ultraviolet ray irradiation on the undercoating film or use an organic material containing propylene glycol monomethyl ether acetate, coating unevenness is unlikely to show up in the organic thin film 20 even when an organic material of low viscosity is employed and therefore the uniformity of the thickness of the organic thin film 20 can be improved. When the anti-reflection film made of the organic thin film 20 can be uniformly fabricated, the resist film as well can be uniformly coated on the anti-reflection film and it becomes thereby possible to make the resist pattern finer. Then it also becomes possible to provide electronic devices of finer design rules.

Further, compared with the first embodiment, the third embodiment does not need the wet-cleaning process (see FIG. 1B) for the undercoating film 11. As a result, the organic thin film fabrication process can be simplified and its processing time can be shortened.

In the third embodiment, the thickness of the organic thin film 20 is not limited to a particular value. However, if it is 100 nm or thinner, the coating unevenness can be significantly reduced, compared with that provided by the conventional method for fabricating an organic thin film. In the third embodiment, the organic thin film 20 which was about 60 nm in thickness was formed. When an ultra-thin (about 20 nm) organic thin film was formed by the method of this embodiment, there was no coating unevenness recognized.

The amount of an organic liquid that is dropped on the semiconductor substrate 10 for the formation of the organic thin film 20 is not limited to a specific value in the third embodiment. However, if it is at least 0.8 ml, coating unevenness does not occur in the organic thin film 20. Besides, as the amount of the liquid organic material is increased, the organic material easily spreads over the semiconductor substrate 10 with a uniform thickness and then it becomes easier to make the thickness of the organic thin film 20 uniform.

In the third embodiment, it is not always necessary to perform the heating using the heater 70 during the far ultraviolet ray irradiation process of FIG. 8B.

Also in the third embodiment, instead of the organic thin film 20 formed as an anti-reflection film, a photosensitive organic film serving as a resist film or an organic insulating film serving as an inter-layer film may be formed.

Further, the semiconductor substrate 10 employed in the third embodiment may be replaced by another substrate, for example, glass substrate.

In the third embodiment, propylene glycol monomethyl ether acetate was used as the solvent for the organic material in the fabrication of the organic thin film 20. If the organic material for use in forming the organic thin film 20 contains at least one solvent of propylene glycol monomethyl ether acetate, propylene glycol monomethyl ether, ethyl lactate, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate, methyl pyruvate and diethylene glycol dimethyl ether, the same effect as that obtained in this embodiment is provided. On the other hand, if cyclohexanone, diglyme or methyl isobutyl ketone is used as the solvent for the organic material in forming the organic thin film 20, the same effect as that of the present embodiment was not provided and coating unevenness was recognized in the fabricated organic thin film.

While there has been described what are at present considered to be preferred embodiments of the invention, it will be understood that various modifications may be made thereto, and it is intended that the appended claims cover all such modification as fall within the true spirit and scope of the invention.

What is claimed is:

1. A method for fabricating an organic thin film comprising the steps of:
    forming an undercoating film made of silicon nitride or silicon nitride oxide on a substrate;
    wet-cleaning said undercoating film using a cleaning liquid comprising $CO_2$-dissolved water;
    irradiating far ultraviolet ray onto said undercoating film of which wet-cleaning has been completed; and
    forming an organic thin film on said undercoating film onto which far ultraviolet ray has been irradiated by turning said substrate and supplying a liquid organic material onto said substrates.

2. The method for fabricating an organic thin film according to claim 1, wherein said step of wet-cleaning includes the step of applying ultrasonic wave in said cleaning liquid.

3. The method for fabricating an organic thin film according to claim 1, further comprising a step of forming another organic thin film on said undercoating film and then removing this organic thin film between the step of depositing said undercoating film and the step of wet-cleaning.

4. The method for fabricating an organic thin film according to claim 1, wherein said step of irradiating far ultraviolet ray includes a step of performing heat treatment on said substrate.

5. The method for fabricating an organic thin film according to claim 1, wherein a total amount of said liquid organic material used in the step of forming said organic thin film is at least 0.8 ml.

6. A method for fabricating an organic thin film comprising the steps of:
    forming an undercoating film made of silicon nitride or silicon nitride oxide on a substrate;
    wet-cleaning said undercoating film using a cleaning liquid comprising $CO_2$-dissolved water; and
    forming an organic thin film on said undercoating film of which wet-cleaning has been completed by turning said substrate and supplying a liquid organic material onto said substrate;
    wherein said organic material contains at least one solvent selected from the group consisting of propylene glycol monomethyl ether acetate, propylene glycol monomethyl ether, ethyl lactate, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate.

7. The method for fabricating an organic thin film according to claim 6, wherein said step of wet-cleaning includes the step of applying ultrasonic wave in said cleaning liquid.

8. The method for fabricating an organic thin film according to claim 6, further comprising the step of forming another organic thin film on said undercoating film and then removing this organic thin film between the step of forming said undercoating film and the step of wet-cleaning.

9. The method for fabricating an organic thin film according to claim 6, wherein a total amount of said liquid organic material used in the step of forming said organic thin film is at least 0.8 ml.

10. A method for fabricating an organic thin film comprising the steps of:
    forming an undercoating film made of silicon nitride or silicon nitride oxide on a substrate;
    irradiating far ultraviolet ray onto said undercoating film while heating said substrate; and
    forming an anti-reflection film made of a liquid organic material on said undercoating film onto which far ultraviolet ray has been irradiated, by turning said substrate and supplying a liquid organic material onto said substrate.

11. The method for fabricating an organic thin film according to claim 10, wherein a total amount of said liquid organic material used in the step of forming said organic thin film is at least 0.8 ml.

12. The method for fabricating an organic thin film according to claim 1, wherein said organic material is an organic material of low viscosity.

13. The method for fabricating an organic thin film according to claim 6, wherein said organic material is an organic material of low viscosity.

14. The method for fabricating an organic thin film according to claim 10, wherein said organic material is an organic material of low viscosity.

15. The method for fabricating an organic thin film according to claim 10, wherein said organic material contains at least one solvent selected from the group consisting of propylene glycol monomethyl ether acetate, propylene glycol monomethyl ether, ethyl lactate, methyl methoxy propionate, ethyl ethoxy propionate, 2-heptanone, ethyl pyruvate, diethylene glycol monomethyl ether, methyl cellosolve acetate, propylene glycol monoethyl ether acetate, ethyl methoxy propionate, methyl lactate and methyl pyruvate.

16. The method for fabricating an organic thin film according to claim 10, wherein said anti-reflection film has a thickness of about 100 nm or thinner.

* * * * *